(12) United States Patent
Jiang et al.

(10) Patent No.: US 11,480,992 B1
(45) Date of Patent: Oct. 25, 2022

(54) TECHNIQUES FOR PHASE SHIFT REDUCTION IN A SINGLE CRYSTAL MULTIPLE OUTPUT CLOCK SYSTEM

(71) Applicant: QUALCOMM Incorporated, San Diego, CA (US)

(72) Inventors: Jize Jiang, Singapore (SG); Ilker Deligoz, Chandler, AZ (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/154,726

(22) Filed: Jan. 21, 2021

(51) Int. Cl.
  *G06F 1/06* (2006.01)
  *G05F 1/46* (2006.01)
  *H04B 1/40* (2015.01)
  *H03F 3/24* (2006.01)

(52) U.S. Cl.
  CPC ............ *G06F 1/06* (2013.01); *G05F 1/46* (2013.01); *H03F 3/245* (2013.01); *H03F 2200/294* (2013.01); *H03F 2200/451* (2013.01); *H04B 1/40* (2013.01)

(58) Field of Classification Search
  CPC ... G06F 1/06; G05F 1/46; H03F 3/245; H03F 2200/294; H03F 2200/451; H04B 1/40
  USPC ....................................................... 327/293
  See application file for complete search history.

(56) References Cited

U.S. PATENT DOCUMENTS

| | | | |
|---|---|---|---|
| 5,446,420 A | 8/1995 | Westwick | |
| 9,985,644 B1 * | 5/2018 | Zhao | H03M 1/82 |
| 11,177,819 B1 * | 11/2021 | Wu | H03M 1/82 |
| 2002/0167363 A1 | 11/2002 | Yang et al. | |
| 2007/0103248 A1 | 5/2007 | Nakamura et al. | |
| 2009/0088194 A1 | 4/2009 | Petty, Jr. et al. | |
| 2010/0194471 A1 | 8/2010 | Raghunathan et al. | |

FOREIGN PATENT DOCUMENTS

| | | |
|---|---|---|
| WO | 2018119153 A2 | 6/2018 |
| WO | 2020053879 A1 | 3/2020 |

OTHER PUBLICATIONS

International Search Report and Written Opinion—PCT/US2022/070089—ISA/EPO—dated Jun. 8, 2022.
Small C.H., "High System Speeds are Making Clock Design a Critical Problem," Computer Design, Pennwell Publ. Littleton, Massachusetts, US, vol. 37, No. 3, Mar. 1, 1998 (Mar. 1, 1998), XP000778875, 9 Pages, ISSN: 0010-4566, p. 32-p. 36.

* cited by examiner

*Primary Examiner* — Tomi Skibinski
(74) *Attorney, Agent, or Firm* — Patterson & Sheridan, LLP (57) ABSTRACT

Certain aspects of the present disclosure provide a circuit for clock signal generation. The circuit generally includes a plurality of clock generation circuits configured to generate a plurality of clock signals from a clock signal, and a power supply circuit having an output coupled to power supply inputs of the plurality of clock generation circuits. The circuit may also include a capacitor array coupled to the output of the power supply circuit and include a plurality of capacitive elements, the capacitor array being configured to selectively couple each of the plurality of capacitive elements to the output of the power supply circuit based on a quantity of one or more active clock generation circuits of the plurality of clock generation circuits.

30 Claims, 7 Drawing Sheets

TECHNIQUES FOR PHASE SHIFT REDUCTION IN A SINGLE CRYSTAL MULTIPLE OUTPUT CLOCK SYSTEM

BACKGROUND

Field of the Disclosure

Certain aspects of the present disclosure generally relate to electronic components and, more particularly, clock generation circuitry.

Description of Related Art

A wireless device may include radio frequency (RF) front-end (RFFE) circuitry for processing and amplifying signals for transmission and reception. In some implementations, a wireless device may include separate RF chips, each including RFFE circuitry, for wireless transmission and reception for various applications such as near field communication (NFC) or cellular communication. Each of the RF chips may operate using an RF clock signal that may be generated via a power management integrated circuit (PMIC). For instance, the PMIC may include a regulator for generating a supply voltage, which may be used by clock buffers to buffer an oscillating signal generated via a crystal oscillator. In some cases, multiple clock buffers may be used to buffer the oscillating signal for generation of multiple RF clock signals to be provided to the RF chips.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include reduced cost and area consumption associated with clock generation circuitry.

Certain aspects of the present disclosure provide a circuit for clock signal generation. The circuit generally includes a plurality of clock generation circuits configured to generate a plurality of clock signals from a clock signal, and a power supply circuit having an output coupled to power supply inputs of the plurality of clock generation circuits. The circuit may also include a capacitor array coupled to the output of the power supply circuit and include a plurality of capacitive elements, the capacitor array being configured to selectively couple each of the plurality of capacitive elements to the output of the power supply circuit based on a quantity of one or more active clock generation circuits of the plurality of clock generation circuits.

Certain aspects of the present disclosure provide a method for clock signal generation. The method generally includes activating one or more clock generation circuits of a plurality of clock generation circuits, generating one or more clock signals from a clock signal via the one or more active clock generation circuits, and generating, via a power supply circuit, a supply voltage at an output of the power supply circuit coupled to power supply inputs of the plurality of clock generation circuits. In certain aspects, the method may also include selectively coupling each of a plurality of capacitive elements to the output of the power supply circuit based on a quantity of the one or more active clock generation circuits.

Certain aspects of the present disclosure provide an apparatus for clock signal generation. The apparatus generally includes means for activating one or more clock generation circuits of a plurality of clock generation circuits, the one or more active clock generation circuits being configured to generate one or more clock signals from a clock signal, and means for generating a supply voltage at an output of the means for generating coupled to power supply inputs of the plurality of clock generation circuits. The apparatus may also include means for selectively coupling each of a plurality of capacitive elements to the output of the means for generating based on a quantity of the one or more active clock generation circuits.

Certain aspects of the present disclosure provide a computer-readable medium having instructions stored thereon to cause a processor to activate one or more clock generation circuits of a plurality of clock generation circuits, the one or more active clock generation circuits being configured to generate one or more clock signals from a clock signal. The computer-readable medium may also include instructions stored thereon to cause the processor to selectively couple each of a plurality of capacitive elements to an output of a power supply circuit based on a quantity of the one or more active clock generation circuits, the power supply circuit being configured to generate a supply voltage at the output of the power supply circuit coupled to the power supply inputs of the plurality of clock generation circuits.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure generally relate to clock generation circuitry having different clock buffers for generating separate clock signals to be provided to multiple radio frequency (RF) chips. Each of the RF chips may include RF front-end (RFFE) circuitry for processing signals for transmission and reception for various applications. At any point in time, one or more of the clock buffers may be active, and the clock buffers may be supplied a common supply signal. Depending on the quantity of clock buffers that are active, the supply signal may experience varying levels of undershoot (e.g., voltage droop) when outputs of the active clock buffers transition from one logic state to another. This variation may cause differing rise times of clock signals generated by the active clock buffers, resulting in a phase shift associated with the clock signals and adversely impacting the operation of the corresponding RF chips to which the clock signals are provided. Certain aspects of the present disclosure provide a capacitor array that selectively couples capacitive elements to a supply node providing the supply voltage based on the quantity of active clock buffers. In this manner, the variation in the undershoot on the supply voltage is reduced, in effect reducing the phase shift associated with the clock signals.

Example Wireless Communications

Figure 1:
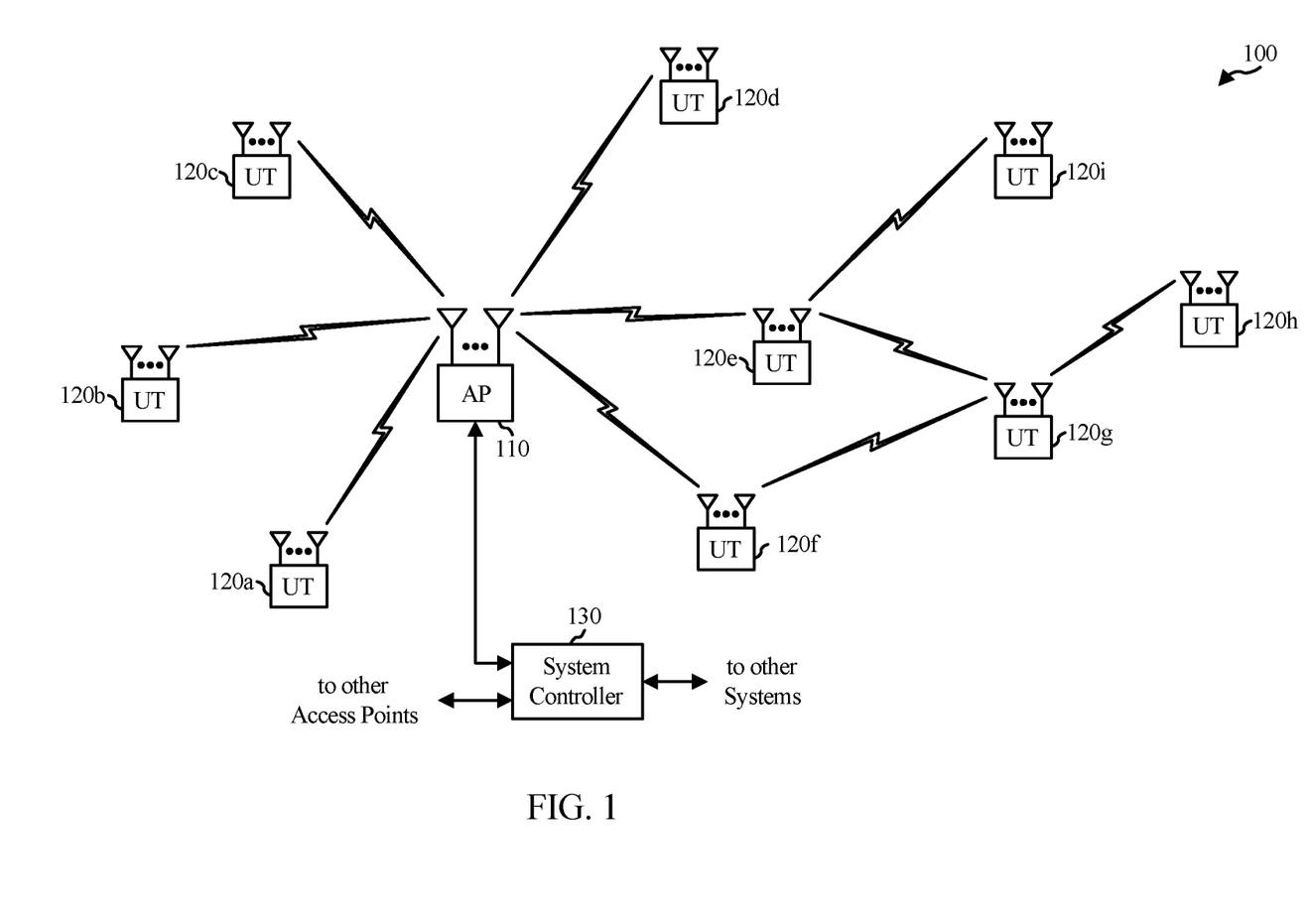
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., to keep costs down) or multiple antennas (e.g., where the additional cost can be supported).

In some aspects, the user terminal 120 or access point 110 may include multiple RF chips for transmission and reception of signals for various applications. The multiple chips may receive separate clock signals that are generated using a common supply voltage. In certain aspects, a capacitor array may be used to reduce a phase shift associated with the clock signals, improving operations of the RF chips, as described in more detail herein.

Figure 2:
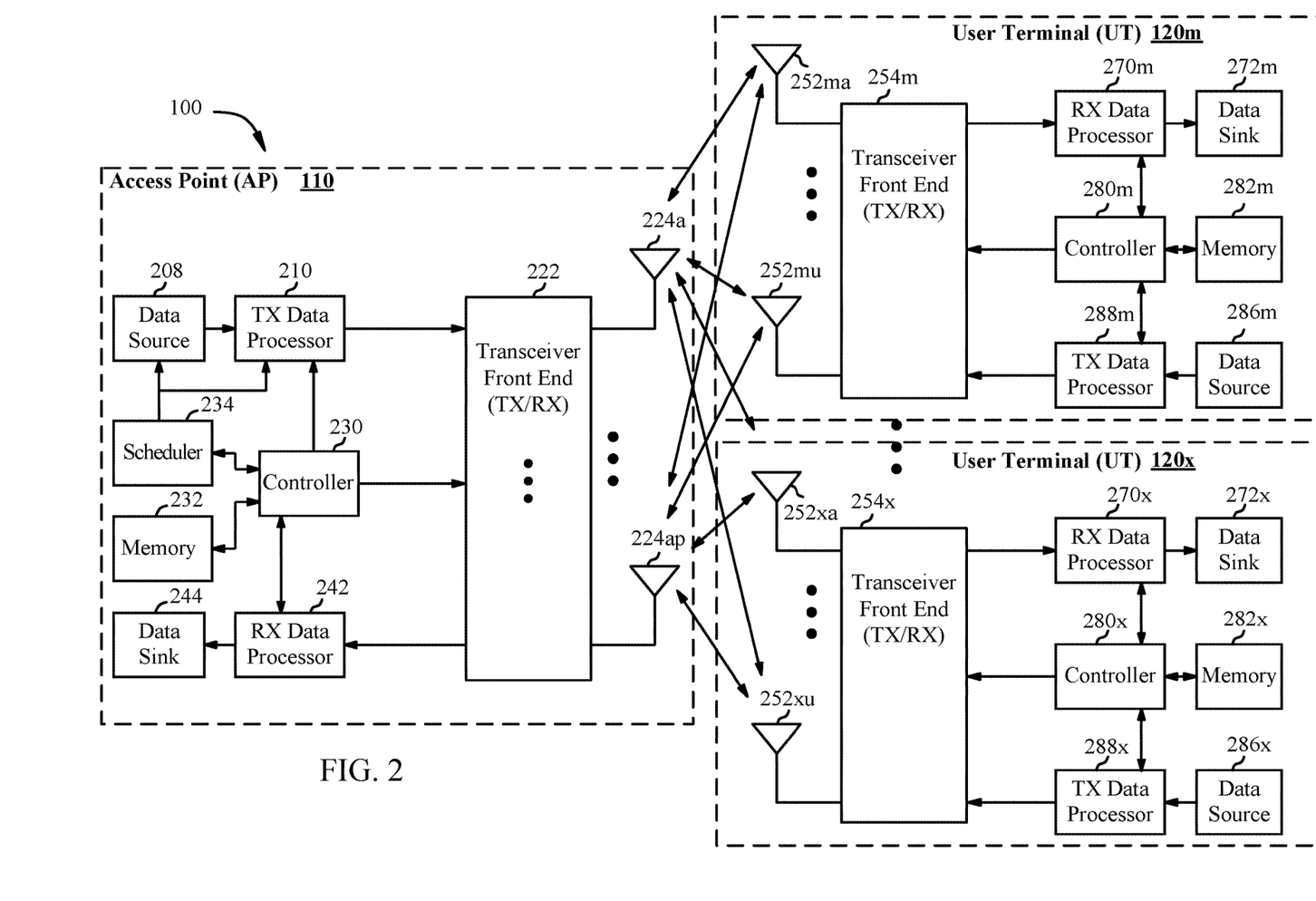
FIG. 2 is a block diagram of an example access point (AP) and example user terminals, in accordance with certain aspects of the present disclosure.

FIG. 2 shows a block diagram of access point 110 and two user terminals 120m and 120x in the wireless communications system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering, beamforming, or some other spatial processing technique may be used at the access point and/or user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254

(also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one or more of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

In some aspects, the transceiver front end 254 or 222 may include multiple RF chips for transmission and reception of signals for various applications. The multiple chips may receive separate clock signals that are generated using a common supply voltage. In certain aspects, a capacitor array may be used to reduce a phase shift associated with the clock signals, improving operations of the RF chips, as described in more detail herein.

Figure 3:
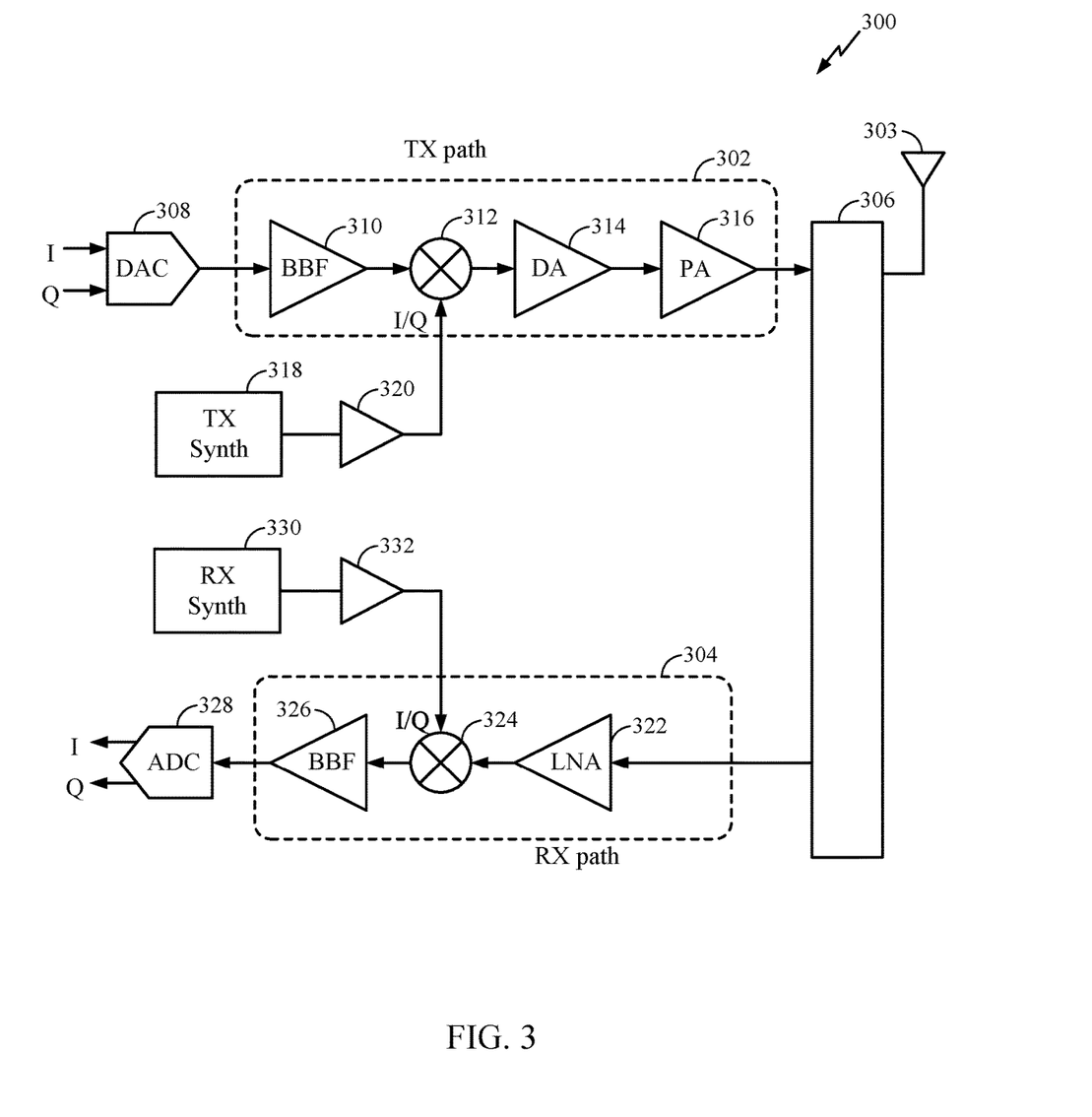
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC.

The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning the LO to different frequencies typically entails using a variable-frequency oscillator, which may involve compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

In some cases, the transceiver front end 300 may be part of an RF chip and operate using a clock signal that is generated using a supply voltage that is also used for generating one or more other clock signals for other RF chips. In certain aspects, a capacitor array may be used to reduce a phase shift associated with the clock signal, improving operations of the transceiver front end 300, as described in more detail herein.

Example Techniques for Clock Generation

As described herein, a wireless device may be implemented with multiple radio frequency (RF) chips for various applications. Each of the RF chips may operate using separate RF clock signals. In some cases, the RF clock signals may be generated using a single crystal oscillator (XO). A multiple clock scheme based on a single XO offers cost savings compared to having an individual XO for each of the multiple clocks. However, this single XO multi-output clock architecture leads to interdependencies among the clock channels, which can lead to performance degradation resultant from phase shift associated with the clock channels. Certain aspects of the present disclosure are generally directed to techniques for reducing the performance degradation associated with the single XO multi-output clock architecture in a manner that saves cost and area consumption as compared to conventional applications.

Figure 4:
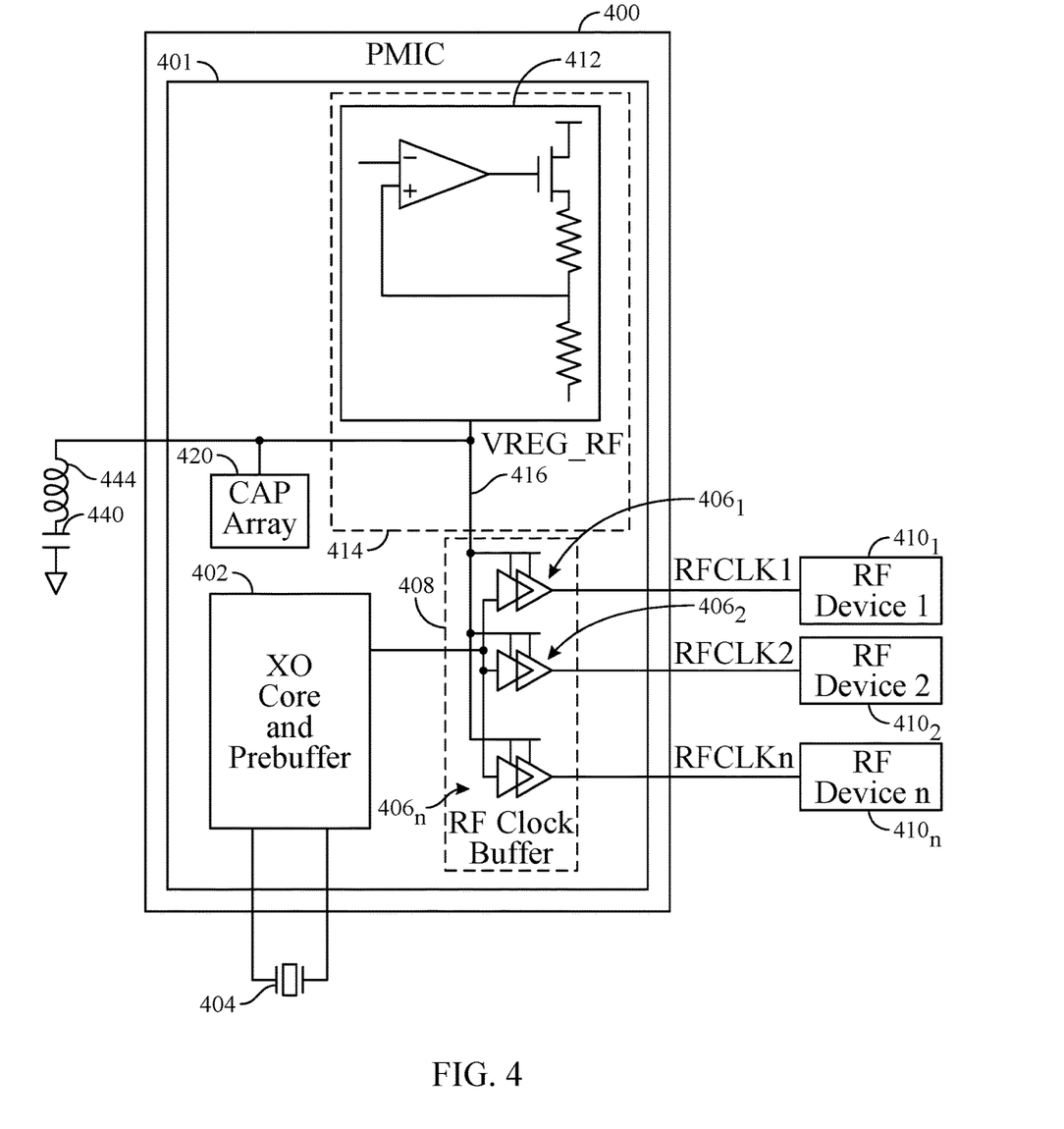
FIG. 4 illustrates a power management integrated circuit (PMIC) implemented with a single crystal oscillator (XO) multi-output clock architecture, in accordance with certain aspects of the present disclosure.

FIG. 4 illustrates a power management integrated circuit (PMIC) 400 implemented with a single XO multi-output clock architecture, in accordance with certain aspects of the present disclosure. The PMIC 400 may be implemented with a clock generation system 401 having clock generation circuits for generating n separate RF clock signals RFCLK1, RFCLK2, RFCLKn to be provided to RF devices $410_1$, $410_2$, ..., $410_n$ (e.g., RF chips). For instance, the PMIC may include XO core and prebuffer circuitry 402 coupled to a XO 404, which may be external to the PMIC. The XO core and prebuffer circuitry 402 generates a prebuffered clock signal that is provided to RF clock buffer circuitry 408. The RF clock buffer circuitry 408 may include separate clock buffers $406_1$, $406_2$, ..., $406_n$, n being an integer greater than 2. As illustrated, each of the clock buffers $406_1$, $406_2$, ..., $406_n$ generates a respective one of the RF clock signals RFCLK1, RFCLK2, RFCLKn to be provided to a respective one of the RF devices $410_1$, $410_2$, ..., $410_n$.

While the example PMIC 400 is implemented with three clock buffers for generating three different clock signals to facilitate understanding, the aspects described herein may be applied to implementations used to generate two or more clock signals (e.g. using two or more clock buffers). Moreover, while the examples provided herein are described for RF clock signals, the aspects described herein may be applied for generating clock signals at any suitable frequency for various applications.

As illustrated, the RF clock buffers $406_1$, $406_2$, ..., $406_n$ may be supplied by the same regulated supply voltage (VREG_RF) generated by a power supply circuit 414 at output 416. As illustrated, the power supply circuit 414 may include a regulator 412 (e.g., low-dropout (LDO) regulator) for generating VREG_RF at the output 416 of the power supply circuit 414. VREG_RF may be provided to supply inputs of the clock buffers $406_1$, $406_2$, ..., $406_n$ for generating multiple clock signals. However, using a single supply voltage for generating multiple clock signals may suffer from a power-supply-pulling effect. For instance, the output of one of the clock buffers $406_1$, $406_2$, ..., $406_n$ may experience a phase shift when another one of the clock buffers $406_1$, $406_2$, ..., $406_n$ is activated (e.g., enabled), as described in more detail herein with respect to FIG. 5. In some aspects, a capacitor array 420 may be coupled to the output 416 of the power supply circuit 414 to reduce this phase shift, as described in more detail herein.

Figure 5:
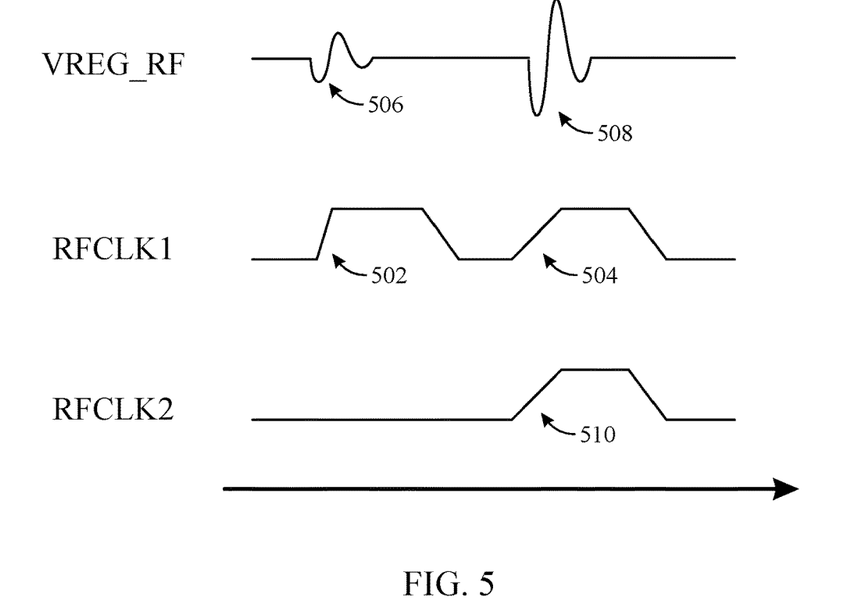
FIG. 5 illustrates radio frequency (RF) clock signals and a supply voltage waveform for generating the RF clock signals of a PMIC implementation without a capacitor array.

FIG. 5 illustrates the RF clock signals RFCLK1 and RFCLK2, and the supply voltage waveform VREG_RF for generating the RF clock signals of a PMIC implementation without the capacitor array 420. As illustrated, RFCLK1 may have a rise time 502 during a clock cycle and a second rise time 504 during a subsequent clock cycle. As illustrated, the rise time 504 may be longer than the rise time 502, due to an increased undershoot of VREG_RF during the logic transition (e.g., rise time 504) of RFCLK1 caused by RFCLK2 being activated for the subsequent clock cycle. For example, a ringing (e.g., an oscillation) of VREG_RF may occur when one or more of the RFCLK1, RFCLK2, RFCLKn signals transition from logic low to logic high, and the amount of undershoot associated with the ringing is dependent on the quantity of RF clocks that are active and simultaneously transitioning from logic low to logic high. For example, as illustrated in FIG. 5, a relatively lower undershoot 506 may occur when only RFCLK1 is active, and a relatively higher undershoot 508 may occur when both RFCLK1 and RFCLK2 are active. The higher undershoot 508 results in the longer rise time 504, as well as a similar rise time 510 for RFCLK2. This variation in rise times 502, 504 may result in a phase shift of RFCLK1, adversely impacting the performance of the RF device $410_1$ to which RFCLK1 is provided.

As illustrated in FIG. 4, an off-chip (e.g., off-PMIC 400) capacitive element 440 may be coupled to the output 416 of the power supply circuit 414. The capacitive element 440 (and associated routing) may have a parasitic inductance 444, which may contribute to the ringing on VREG_RF, as described with respect to FIG. 5. To reduce the ringing, a relatively large capacitive element (e.g., about 1 nF) may be implemented on the PMIC 400. However, the inclusion of such a large capacitive element may result in higher cost and area for the PMIC.

In certain aspects of the present disclosure, the capacitor array 420 may be coupled to the output 416 in order to reduce the amount of variation in the undershoot associated VREG_RF, resulting in a reduction of the clock phase shift associated with the RF clock signals described herein. In other words, instead of implementing a relative large capacitive element on the PMIC to reduce the ringing associated with VREG_RF, a capacitor array may be implemented with a programmable capacitance configured to reduce variation in the undershoot when different combinations of clock buffers are activated. The reduction of the variation in undershoot improves the phase shift associated with the clock signals without the implementation of the relatively large on-chip capacitive element, reducing cost and area consumption.

Figure 6:
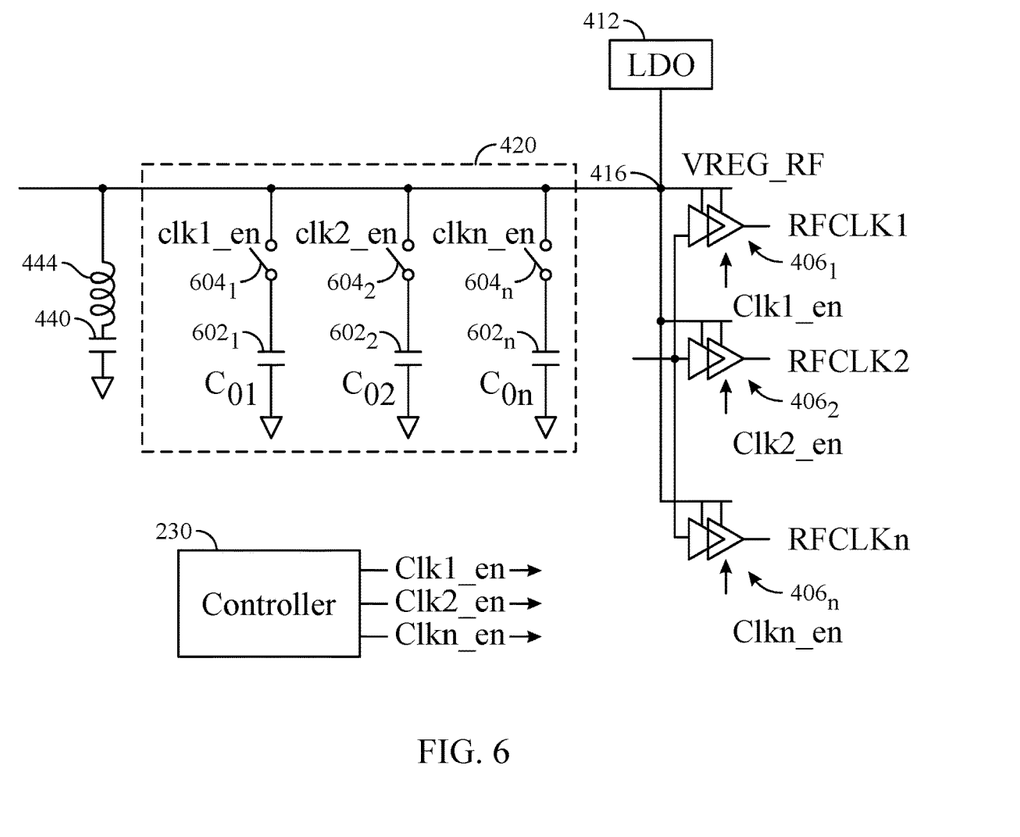
FIG. 6 illustrates an example implementation of a capacitor array of a PMIC, in accordance with certain aspects of the present disclosure.

FIG. 6 illustrates an example implementation of the capacitor array 420, in accordance with certain aspects of the present disclosure. As illustrated, the capacitor array 420 includes capacitive elements $602_1$, $602_2$, ..., $602_n$, each selectively coupled to the output 416 via a respective one of switches $604_1$, $604_2$, ..., $604_n$. At least one of the capacitive elements $602_1$, $602_2$, ..., $602_n$ may be implemented using a capacitor. While the example capacitor array 420 is implemented with the same quantity of capacitive elements $602_1$, $602_2$, ..., $602_n$ as clock buffers $406_1$, $406_2$, ..., $406_n$, the capacitor array 420 may be implemented with a different quantity of capacitive elements than clock buffers. The capacitor array 420 may be configured to couple a greater quantity of capacitive elements to output 416 when a first clock buffer is activated as compared to when a second clock buffer is activated (e.g., due to the first clock buffer having a higher load). Each of the capacitive elements $602_1$, $602_2, \ldots, 602_n$ may be controlled via a respective one of clock enable signals clk1_en, clk2_en, ..., clkn_en. The clock enable signals clk1_en, clk2_en, ..., clkn_en may also be used to enable (activate) respective clock buffers $406_1, 406_2, \ldots, 406_n$, as illustrated. For instance, switch $604_1$ may be closed if the clock buffer $406_1$ is enabled (e.g., active), switch $604_2$ may be closed if the clock buffer $406_2$ is enabled (e.g., active), and so on. As illustrated, the clock enable signals clk1_en, clk2_en, ..., clkn_en may be generated via the controller 230. In certain aspects, capacitive element 440 may have a lower capacitance as compared to an implementation of the PMIC without the capacitor array 420. Capacitive element 440 may provide a baseline level of filtering when all switches of the capacitor array 420 are open.

Figure 7:
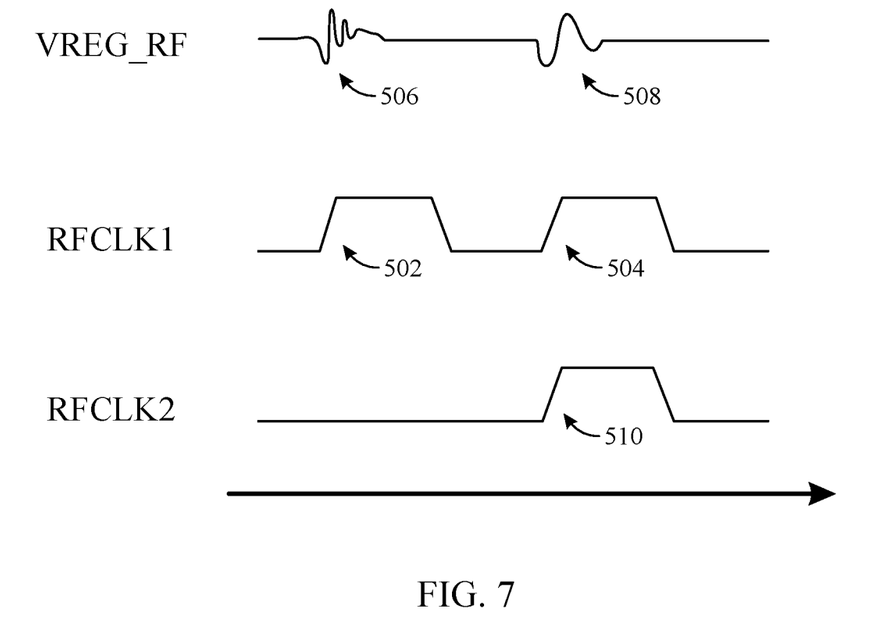
FIG. 7 illustrates RF clock signals and a supply voltage waveform associated with a PMIC implemented with a capacitor array, in accordance with certain aspects of the present disclosure.

FIG. 7 illustrates the RF clock signals RFCLK1 and RFCLK2 and the supply voltage waveform VREG_RF associated with the PMIC 400 implemented with the capacitor array 420, in accordance with certain aspects of the present disclosure. As illustrated, the variation between undershoots 506, 508 of VREG_RF is absent, or at least reduced, by the implementation of the capacitor array 420. In other words, during the first clock cycle of RFCLK1, capacitive element $602_1$ may be coupled to the output 416. During the second clock cycle of RFCLK1, both capacitive elements $602_1$, $602_2$ may be coupled to the output 416 since both RFCLK1 and RFCLK2 are active. Thus, the undershoot 508 is reduced to about the same level as undershoot 506 such that the undershoot variation between clock cycles is reduced, in effect reducing the phase shift associated with RFCLK1. The ringing associated with undershoot 506 may have a higher frequency than the ringing associated with the undershoot 508 due to the varying quantity of capacitive elements that are coupled to the output 416.

Figure 8:
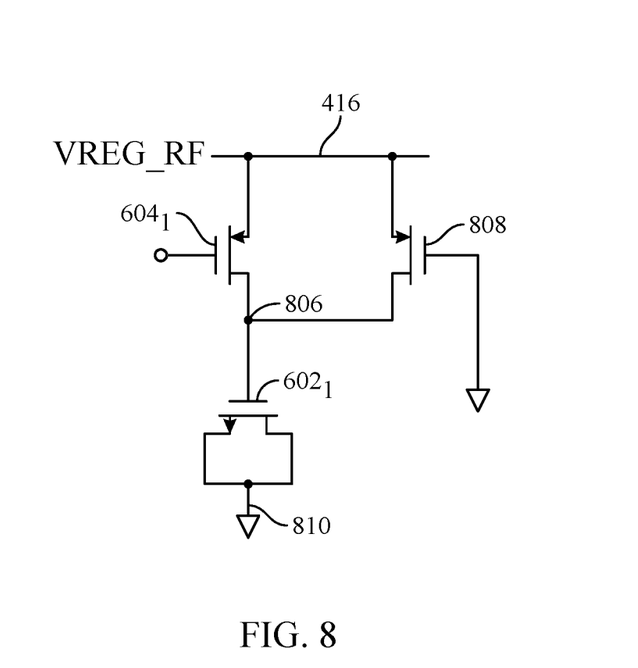
FIG. 8 illustrates an example implementation of a switch and capacitive element of a capacitor array, in accordance with certain aspects of the present disclosure.

FIG. 8 illustrates an example implementation of a switch and capacitive element of the capacitor array 420, in accordance with certain aspects of the present disclosure. For example, the switch $604_1$ may be implemented with a transistor (e.g., n-type metal-oxide-semiconductor (NMOS) transistor), and the capacitive element $602_1$ may be implemented using a transistor (e.g., p-type metal-oxide-semiconductor (PMOS) transistor). For instance, the gate of the PMOS transistor (e.g., capacitive element $602_1$) may be coupled to the switch $604_1$, while a source and a drain of the PMOS transistor are coupled to a reference potential node (e.g., electric ground). The transistor implementing switch $604_1$ may have a source coupled to output 416, a drain coupled to the capacitive element $602_1$, and a gate configured to receive a clock enable signal CLK1_enb (e.g., inverse of CLK1_en).

There may be a leakage current associated with the capacitive element $602_1$. Thus, while the switch $604_1$ is open, the voltage at node 806 may decrease due to the leakage of capacitive element $602_1$, resulting in a disturbance on VREG_RF when switch $604_1$ is closed.

In some aspects, a resistive element may be coupled in parallel with switch $604_1$ in an attempt to compensate for the leakage current associated with the capacitive element $602_1$. For example, the resistive element may be implemented using transistor 808 (e.g., PMOS transistor) having a source coupled to output 416, a drain coupled to the capacitive element $602_1$, and a gate which may be biased to implement the resistive element. A resistance of the resistive element (on-resistance of the PMOS transistor) may be configured such that a current is supplied from output 416 to the capacitive element $602_1$ through the resistance element to compensate for the leakage current of the capacitive element $602_1$ to avoid the voltage drop at node 806 (or at least reduce the voltage drop at node 806).

Figure 9:
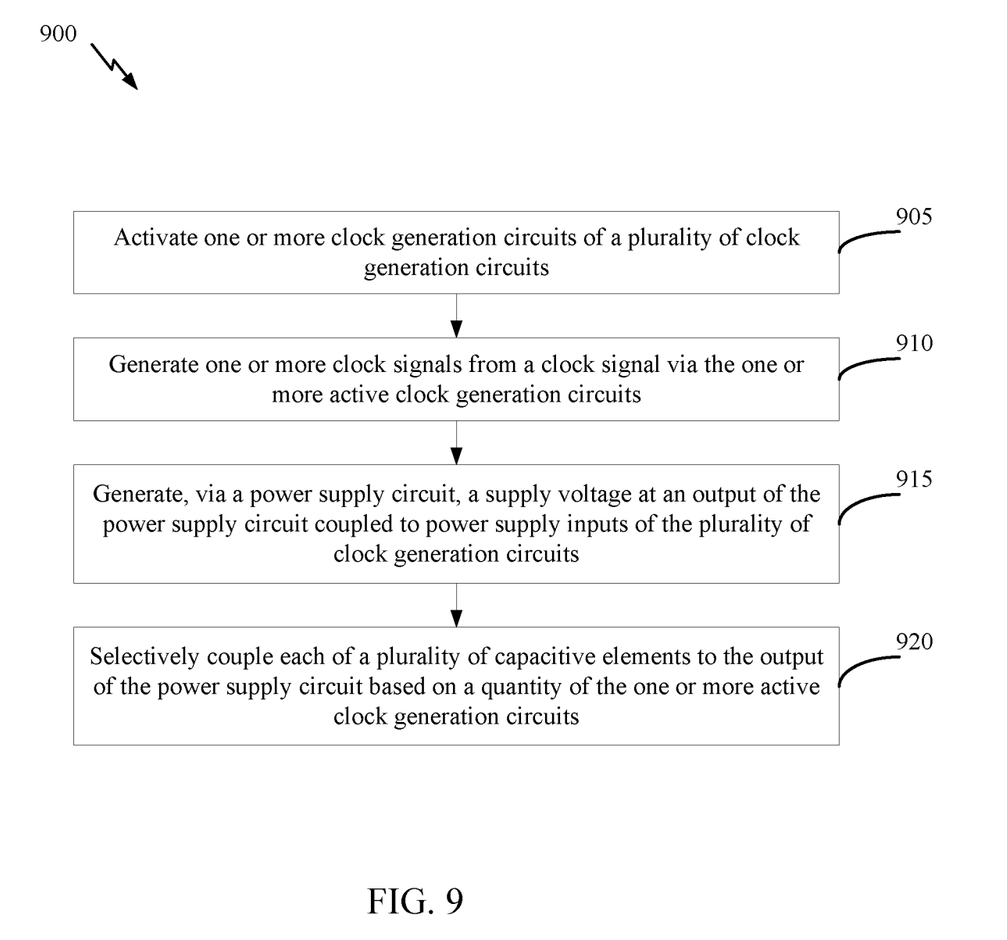
FIG. 9 is a flow diagram depicting example operations for clock signal generation, in accordance with certain aspects of the present disclosure.

FIG. 9 is a flow diagram depicting example operations 900 for clock signal generation, in accordance with certain aspects of the present disclosure. The operations 900 may be performed by a clock generation system, such as the clock generation system 401.

The operations 900 begin, at block 905, with the clock generation system activating one or more clock generation circuits of a plurality of clock generation circuits (e.g., clock buffers $406_1, 406_2, \ldots, 406_n$). At block 910, the clock generation system generates one or more clock signals (e.g., RFCLK1, RFCLK2, RFCLKn) from a clock signal (e.g., prebuffered clock signal generated by the prebuffer circuitry 402) via the one or more active clock generation circuits. At block 915, the clock generation system generates (e.g., via the power supply circuit 414) a supply voltage (e.g., VREG_RF) at an output (e.g., output 416) of the power supply circuit coupled to power supply inputs of the plurality of clock generation circuits.

At block 920, the clock generation system selectively couples each of a plurality of capacitive elements (e.g., capacitive elements $602_1, 602_2, \ldots, 602_n$) to the output of the power supply circuit based on a quantity of the one or more active clock generation circuits. For instance, a quantity of the plurality of capacitive elements coupled to the output of the power supply circuit may correspond to the quantity of the one or more active clock generation circuits. In some aspects, the clock generation system may change the quantity of the one or more active clock generation circuits, and change the quantity of the plurality of capacitive elements coupled to the output of the power supply circuit based on the changed quantity of the one or more active clock generation circuits. That is, the quantity of the plurality of capacitive elements may be changed such that an undershoot associated with the supply voltage is the same (e.g., within a margin of 30 mV) before and after changing the quantity of the one or more active clock generation circuits.

In some aspects, selectively coupling each of the plurality of capacitive elements may include controlling a switch (e.g., switches $604_1, 604_2, \ldots, 604_n$) coupled between each of the plurality of capacitive elements and the output of the power supply circuit. In some implementations, at least one of the plurality of capacitive elements may include a transistor (e.g., NMOS transistor) having a gate coupled to a respective one of the switches, a drain and a source of the transistor being coupled to a reference potential node (e.g., reference potential node 810). In some aspects, a resistive element (e.g., transistor 808) may be coupled in parallel with at least one of the switches. A resistance of the resistive element may be configured such that a current across the resistive element corresponds to a leakage current of the capacitive element when the switch is open.

In certain aspects, the clock generation system may receive, via each clock generation circuit of the plurality of clock generation circuits, an enable signal (e.g., clock enable signals clk1_en, clk2_en, ..., clkn_en) configured to activate the clock generation circuit, the switch being controlled based on a respective one of the enable signals. In some aspects, the clock generation system may provide, via at least one of the plurality of clock generation circuits, a respective one of the one or more clock signals to a RFFE circuit (e.g., RF devices $410_1, 410_2, \ldots, 410_n$). In some aspects, inputs of the plurality of clock generation circuits may be coupled to an output of an oscillator (e.g., XO 404).

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes and variations may be made in the arrangement, operation and details of the methods and apparatus described above without departing from the scope of the claims.

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering. In certain aspects, means for activating may include a controller, such as the controller 230. In certain aspects, means for generating may include a power supply circuit, such as the power supply circuit 414. In certain aspects, means for selectively coupling may include a capacitor array, such as the capacitor array 420.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

If implemented in software, the functions may be stored or transmitted over as one or more instructions or code on a computer readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer readable storage medium with instructions stored thereon separate from the wireless node, all of which may be accessed by the processor through the bus interface. Alternatively, or in addition, the machine-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

The invention claimed is:

1. A circuit for clock signal generation, comprising:
a plurality of clock generation circuits configured to generate a plurality of clock signals from a clock signal;
a power supply circuit having an output coupled to power supply inputs of the plurality of clock generation circuits; and
a capacitor array coupled to the output of the power supply circuit and comprising a plurality of capacitive elements, the capacitor array being configured to selectively couple each of the plurality of capacitive elements to the output of the power supply circuit based on a quantity of one or more active clock generation circuits of the plurality of clock generation circuits.

2. The circuit of claim 1, wherein the capacitor array is configured such that a quantity of the plurality of capacitive elements coupled to the output of the power supply circuit corresponds to the quantity of the one or more active clock generation circuits.

3. The circuit of claim 1, wherein each of the plurality of clock generation circuit comprises a clock buffer.

4. The circuit of claim 1, wherein the power supply circuit comprises a low-dropout (LDO) regulator.

5. The circuit of claim 1, wherein the capacitor array comprises a switch coupled between each of the plurality of capacitive elements and the output of the power supply circuit.

6. The circuit of claim 5, wherein at least one of the plurality of capacitive elements comprises a transistor having a gate coupled to a respective one of the switches, a drain and a source of the transistor being coupled to a reference potential node.

7. The circuit of claim 6, wherein the transistor comprises an n-type metal-oxide-semiconductor (NMOS) transistor.

8. The circuit of claim 5, wherein at least one of the plurality of capacitive elements comprises a capacitor coupled between a respective one of the switches and a reference potential node.

9. The circuit of claim 5, further comprising a resistive element coupled in parallel with at least one of the switches.

10. The circuit of claim 9, wherein a resistance of the resistive element is configured such that a current across the resistive element corresponds to a leakage current of the capacitive element when the switch is open.

11. The circuit of claim 10, wherein the resistive element is a transistor having a source coupled to the output, a drain coupled to the capacitive element, and a gate biased to implement the resistance.

12. The circuit of claim 5, wherein at least one of the switches comprises a p-type metal-oxide-semiconductor (PMOS) transistor.

13. The circuit of claim 5, wherein each clock generation circuit of the plurality of clock generation circuits is configured to receive an enable signal configured to activate the clock generation circuit, the switch being configured to be controlled based on a respective one of the enable signals.

14. The circuit of claim 13, wherein the enable signal is provided by a controller, wherein the controller is configured to control which of the plurality of clock generation circuits is activated.

15. The circuit of claim 1, wherein at least one of the plurality of clock generation circuits is configured to provide a respective one of the plurality of clock signals to a radio frequency (RF) front-end (RFFE) circuit.

16. The circuit of claim 1, further comprising an oscillator, wherein inputs of the plurality of clock generation circuits are coupled to an output of the oscillator.

17. A method for clock signal generation, comprising:
activating one or more clock generation circuits of a plurality of clock generation circuits;
generating one or more clock signals from a clock signal via the one or more active clock generation circuits;
generating, via a power supply circuit, a supply voltage at an output of the power supply circuit coupled to power supply inputs of the plurality of clock generation circuits; and selectively coupling each of a plurality of capacitive elements to the output of the power supply circuit based on a quantity of the one or more active clock generation circuits.

18. The method of claim 17, wherein a quantity of the plurality of capacitive elements coupled to the output of the power supply circuit corresponds to the quantity of the one or more active clock generation circuits.

19. The method of claim 18, further comprising:
changing the quantity of the one or more active clock generation circuits; and
changing the quantity of the plurality of capacitive elements coupled to the output of the power supply circuit based on the changed quantity of the one or more active clock generation circuits.

20. The method of claim 19, wherein changing the quantity of the one or more active clock generation circuits is performed by a controller providing enabling signals to the clock generation circuits.

21. The method of claim 20, further comprising receiving, via each clock generation circuit of the plurality of clock generation circuits, an enable signal configured to activate the clock generation circuit, the switch being controlled based on a respective one of the enable signals.

22. The method of claim 19, wherein changing the quantity of the plurality of capacitive elements is performed by a controller providing enabling signals to each switch coupled to the respective one of the plurality of capacitive elements.

23. The method of claim 19, wherein the quantity of the plurality of capacitive elements is changed such that an undershoot associated with the supply voltage is the same before and after changing the quantity of the one or more active clock generation circuits.

24. The method of claim 17, wherein each of the plurality of clock generation circuits comprises a clock buffer.

25. The method of claim 17, wherein selectively coupling each of the plurality of capacitive elements comprises controlling a switch coupled between each of the plurality of capacitive elements and the output of the power supply circuit.

26. The method of claim 25, wherein at least one of the plurality of capacitive elements comprises a transistor having a gate coupled to a respective one of the switches, a drain and a source of the transistor being coupled to a reference potential node.

27. The method of claim 25, wherein a resistive element is coupled in parallel with at least one of the switches.

28. The method of claim 27, wherein a resistance of the resistive element is configured such that a current across the resistive element corresponds to a leakage current of the capacitive element when the switch is open.

29. An apparatus for clock signal generation, comprising:
means for activating one or more clock generation circuits of a plurality of clock generation circuits, the one or more active clock generation circuits being configured to generate one or more clock signals from a clock signal;
means for generating a supply voltage at an output of the means for generating coupled to power supply inputs of the plurality of clock generation circuits; and
means for selectively coupling each of a plurality of capacitive elements to the output of the means for generating based on a quantity of the one or more active clock generation circuits.

30. A computer-readable non-transitory medium having instructions stored thereon to cause a processor to:
activate one or more clock generation circuits of a plurality of clock generation circuits, the one or more active clock generation circuits being configured to generate one or more clock signals from a clock signal; and
selectively couple each of a plurality of capacitive elements to an output of a power supply circuit based on a quantity of the one or more active clock generation circuits, the power supply circuit being configured to generate a supply voltage at the output of the power supply circuit coupled to power supply inputs of the plurality of clock generation circuits.

* * * * *